United States Patent
Hasebe et al.

(10) Patent No.: US 9,343,292 B2
(45) Date of Patent: May 17, 2016

(54) STACKED SEMICONDUCTOR DEVICE, AND METHOD AND APPARATUS OF MANUFACTURING THE SAME

(71) Applicant: TOKYO ELECTRON LIMITED, Tokyo (JP)

(72) Inventors: Kazuhide Hasebe, Nirasaki (JP); Tomoyuki Obu, Nirasaki (JP); Masaki Kurokawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/220,557

(22) Filed: Mar. 20, 2014

(65) Prior Publication Data
US 2014/0284808 A1 Sep. 25, 2014

(30) Foreign Application Priority Data

Mar. 21, 2013 (JP) ................................. 2013-057829
Dec. 19, 2013 (JP) ................................. 2013-262167

(51) Int. Cl.
H01L 21/44 (2006.01)
H01L 21/02 (2006.01)
H01L 21/3105 (2006.01)

(52) U.S. Cl.
CPC .......... *H01L 21/022* (2013.01); *H01L 21/0217* (2013.01); *H01L 21/02164* (2013.01); *H01L 21/02211* (2013.01); *H01L 21/02216* (2013.01); *H01L 21/02271* (2013.01); *H01L 21/3105* (2013.01); *H01L 2924/0002* (2013.01)

(58) Field of Classification Search
CPC ............ H01L 21/022; H01L 21/02216; H01L 21/02164; H01L 21/3105; H01L 21/0217; H01L 21/02211; H01L 21/02271; H01L 2924/0002

See application file for complete search history.

(56) References Cited

U.S. PATENT DOCUMENTS

| | | | | |
|---|---|---|---|---|
| 5,970,384 A * | 10/1999 | Yamazaki et al. | ............ | 438/795 |
| 6,028,014 A * | 2/2000 | Sukjarev | ........................ | 438/789 |
| 6,168,980 B1 * | 1/2001 | Yamazaki et al. | ............ | 438/162 |
| 6,602,806 B1 * | 8/2003 | Xia et al. | ........................ | 438/786 |
| 6,642,091 B1 * | 11/2003 | Tanabe | ........................ | 438/166 |
| 6,863,733 B1 * | 3/2005 | Tanabe | ........................ | 118/722 |
| 2003/0049460 A1 * | 3/2003 | O'Neill et al. | ................ | 428/426 |
| 2009/0104790 A1 * | 4/2009 | Liang | ........................ | 438/788 |
| 2009/0139446 A1 * | 6/2009 | Kimura et al. | .................. | 117/77 |

(Continued)

FOREIGN PATENT DOCUMENTS

JP 2009-117843 A 5/2009

*Primary Examiner* — Jarrett Stark
(74) *Attorney, Agent, or Firm* — Nath, Goldberg & Meyer; Jerald L. Meyer

(57) ABSTRACT

Provided is a method of manufacturing a stacked semiconductor device, which includes forming a stacked film on a semiconductor substrate, the stacked film including a plurality of silicon oxide films and a plurality of silicon nitride films, which are alternately arranged on top of each other, and the stacked film being obtained by repeatedly performing a series of operations of forming the silicon oxide film on the semiconductor substrate using one of triethoxysilane, octamethylcyclotetrasiloxane, hexamethyldisilazane and diethylsilane gases, and forming the silicon nitride film on the formed silicon oxide film; etching the silicon nitride films in the stacked film; removing carbons contained in the silicon oxide films, which are not removed in the etching, to reduce a concentration of the carbons; and forming electrodes in regions where the silicon nitride films are etched in the etching.

4 Claims, 7 Drawing Sheets

(56) References Cited

U.S. PATENT DOCUMENTS

| | | |
|---|---|---|
| 2009/0242966 A1 | 10/2009 | Son et al. |
| 2009/0294836 A1* | 12/2009 | Kiyotoshi ............... 257/324 |
| 2012/0252224 A1 | 10/2012 | Endo et al. |
| 2013/0161629 A1* | 6/2013 | Han et al. .................. 257/66 |

* cited by examiner

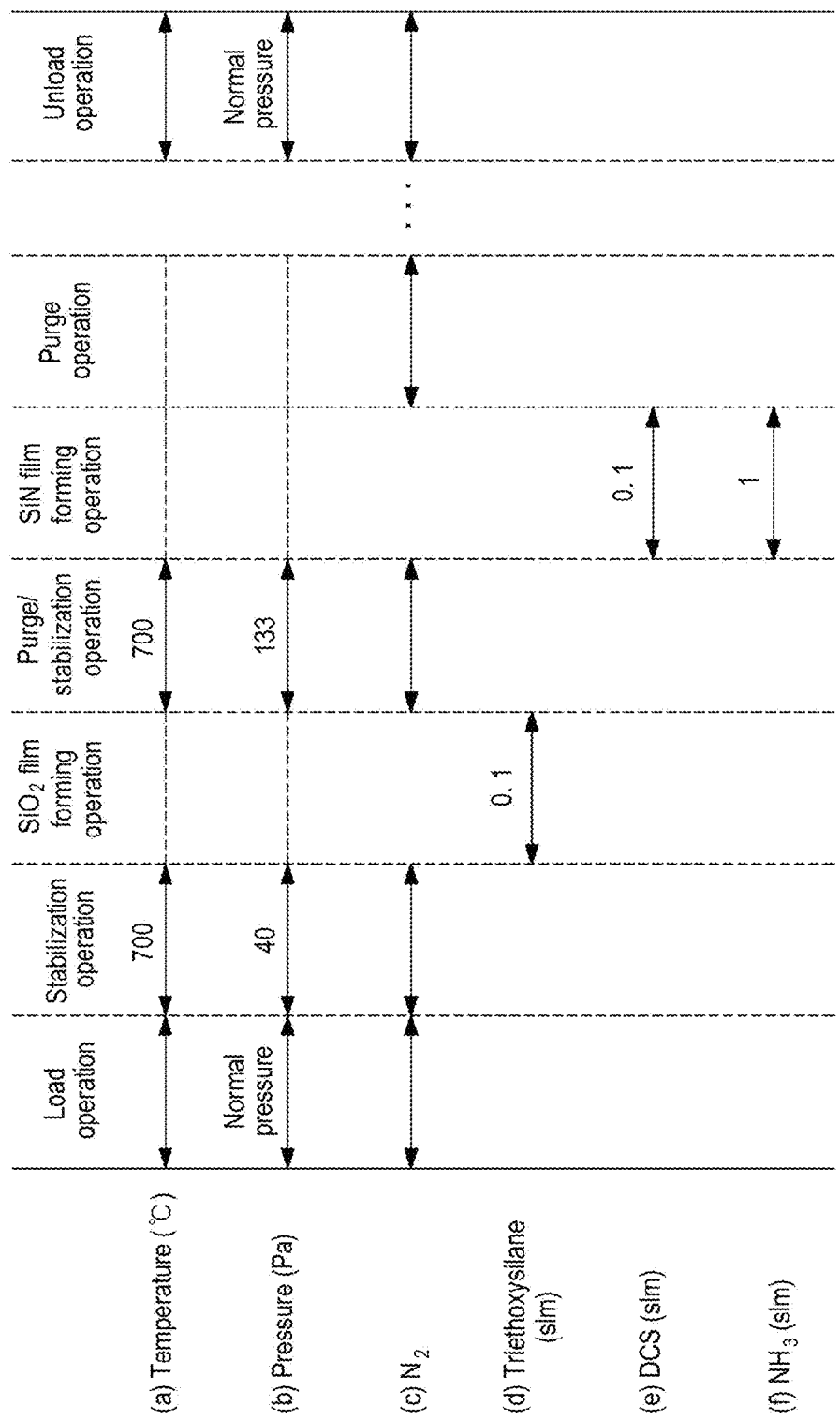

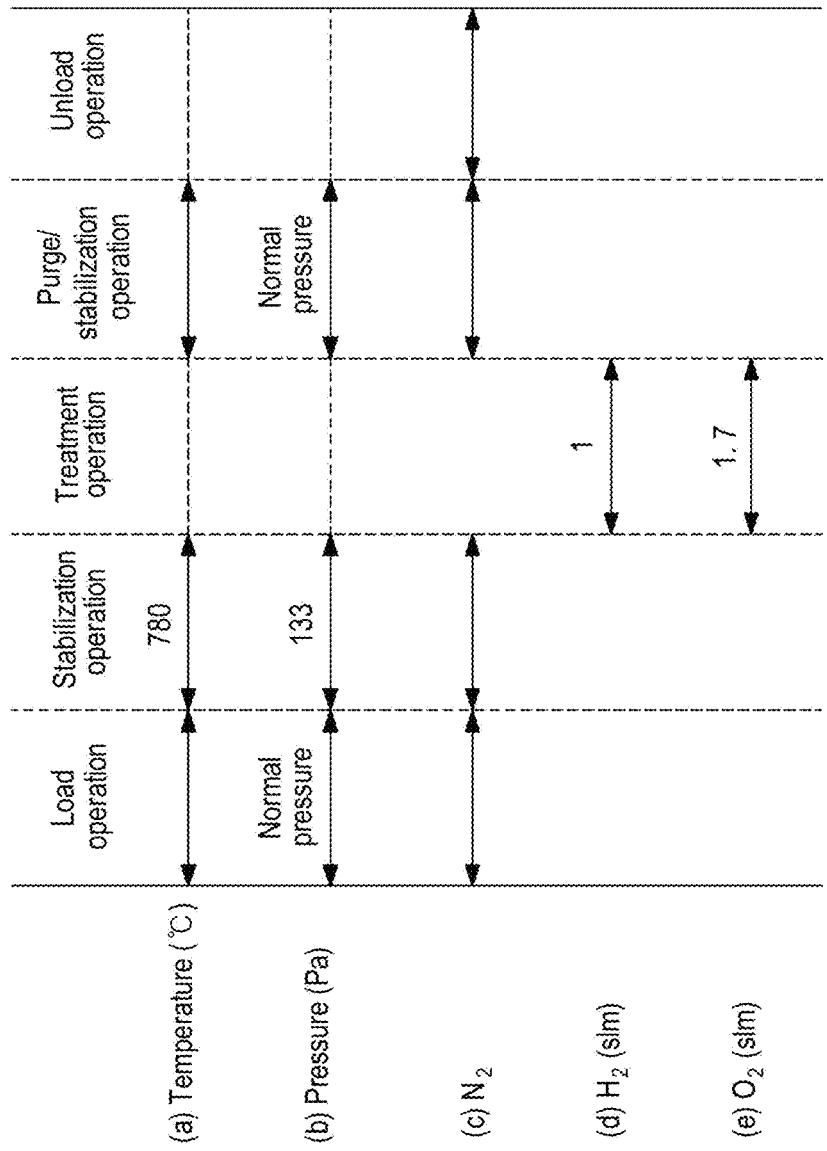

STACKED SEMICONDUCTOR DEVICE, AND METHOD AND APPARATUS OF MANUFACTURING THE SAME

CROSS-REFERENCE TO RELATED APPLICATIONS

This application claims the benefit of Japanese Patent Application Nos. 2013-057829, filed on Mar. 21, 2013; and 2013-262167, filed on Dec. 19, 2013, in the Japan Patent Office, the disclosure of which is incorporated herein in their entirety by reference.

TECHNICAL FIELD

The present disclosure relates to a stacked semiconductor device, and a method and apparatus of manufacturing the stacked semiconductor device.

BACKGROUND

With a recent demand for high integration of semiconductor devices, there have been proposed a stacked semiconductor device in which a stacked film is formed on a semiconductor substrate. The stacked film is obtained by alternately arranging interlayer insulation films and sacrificial films on top of each other. An example of the staked film is a silicon nitride film/silicon oxide film ($SiN/SiO_2$).

A process of manufacturing the stacked semiconductor device includes, alternately forming the interlayer insulation films and the sacrificial films on the semiconductor substrate, and then selectively etching only the sacrificial films. As such, each of silicon oxide films used as the interlayer insulation films is required to have an increased etching resistance, e.g., a diluted hydrofluoric acid (DHF) resistance.

As a method for increasing the DHF resistance of the silicon oxide film, a method of forming a silicon oxide film ($SiO_2$ film) by using, e.g., a triethoxysilane gas is proposed. This method increases the DHF resistance nearly twice as compared with a case where a dichlorosilane (DCS) gas is used to form a HTO (High Temperature Oxide) film.

However, the silicon oxide film formed using the triethoxysilane gas has a high carbon concentration, which causes a poor leak resistance. To address this, in some cases, an additional process is performed to reduce the carbon concentration in the silicon oxide film. However, such process may result in a degradation of the DHF resistance of the silicon oxide film. In this case, it is difficult to manufacture a stacked semiconductor device having good properties.

SUMMARY

Some embodiments of the present disclosure provide a stacked semiconductor device having good properties, and a method and apparatus of manufacturing the stacked semiconductor device.

According to one embodiment of the present disclosure, there is provided a method of manufacturing a stacked semiconductor device, which includes forming a stacked film on a semiconductor substrate, the stacked film including a plurality of silicon oxide films and a plurality of silicon nitride films, which are alternately arranged on top of each other, and the stacked film being obtained by repeatedly performing a series of operations of forming the silicon oxide film on the semiconductor substrate using one of triethoxysilane, octamethylcyclotetrasiloxane, hexamethyldisilazane and diethylsilane gases, and forming the silicon nitride film on the formed silicon oxide film; etching the silicon nitride films in the stacked film; removing carbons contained in the silicon oxide films, which are not removed in the etching, to reduce a concentration of the carbons; and forming electrodes in regions where the silicon nitride films are etched in the etching.

According to another embodiment of the present disclosure, there is provided a stacked semiconductor device manufactured by the aforementioned method.

According to another embodiment of the present disclosure, there is provided an apparatus for manufacturing a stacked semiconductor device, which includes: a processing gas supply unit configured to supply one of triethoxysilane, octamethylcyclotetrasiloxane, hexamethyldisilazane and diethylsilane as a processing gas into a reaction chamber in which a plurality of semiconductor substrates is accommodated; a film-forming gas supply unit configured to supply a gas for forming a silicon nitride film into the reaction chamber; a treatment gas supply unit configured to supply a treatment gas for reducing a concentration of carbons contained in a silicon oxide film into the reaction chamber; a control unit configured to control: the processing gas supply unit and the film-forming gas supply unit to form a stacked film is on a semiconductor substrate, the stacked film including a plurality of silicon oxide films and a plurality of silicon nitride films, which are alternately arranged on top of each other, and the stacked film being obtained by repeatedly performing a series of operations of forming the silicon oxide film on the semiconductor substrate using the processing gas, and forming the silicon nitride film on the formed silicon oxide film using the film-forming gas; and the treatment gas supply unit to reduce the concentration of carbons contained in the silicon oxide film after a shaping process of the stacked semiconductor device.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a view showing a recipe for explaining an operation of forming a stacked film.

FIG. 10 is a view showing a recipe for explaining a treatment process.

DETAILED DESCRIPTION

Reference will now be made in detail to various embodiments of a stacked semiconductor device, a method and apparatus of manufacturing the stacked semiconductor device, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, a stacked semiconductor device manufacturing method according to one embodiment of the present disclosure will be described. FIGS. 1 to 6 are views illustrating the stacked semiconductor device manufacturing method according to one embodiment of the present disclosure. In this embodiment, a case, where a triethoxysilane gas is used to form silicon oxide films used as interlayer insulation films of a stacked semiconductor device, will be described.

Figure 1:
FIG. 1 is a view illustrating a method of forming a silicon oxide film in a method of manufacturing a stacked semiconductor device according to one embodiment of the present disclosure.

As shown in FIG. 1, a silicon oxide ($SiO_2$) film 52 is formed on a semiconductor substrate 51 using the triethoxysilane gas. The silicon oxide film 52 may be formed by, e.g., a CVD (Chemical Vapor Deposition) method. Specifically, the semiconductor substrate 51 is accommodated in a reaction chamber of a stacked semiconductor device manufacturing apparatus (which will be described later) and subsequently, the triethoxysilane gas is supplied into the reaction chamber at 10 to 300 sccm while maintaining an internal temperature of the reaction chamber at 650 to 750 degrees C. and an internal pressure of the reaction chamber at 13.3 to 133 Pa (0.1 to 1 Torr) so that the silicon oxide film 52 is formed on the semiconductor substrate 51.

In this manner, the use of the triethoxysilane gas in forming the silicon oxide film 52 can improve the DHF resistance of the silicon oxide film 52 nearly twice as compared with a case where a dichlorosilane gas is used to form a HTO film. Meanwhile, the silicon oxide film 52 formed by the triethoxysilane gas has a high carbon concentration, thus resulting in a poor leak resistance, which will be described later.

Figure 2:
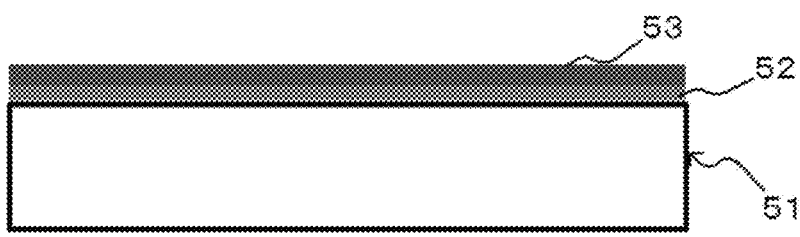
FIG. 2 is a view illustrating a method of forming a silicon nitride film on a silicon oxide film in a method of manufacturing a stacked semiconductor device according to one embodiment of the present disclosure.

Subsequently, as shown in FIG. 2, a silicon nitride (SiN) film 53 as a sacrificial film is formed on the silicon oxide film 52. The silicon nitride film 53 may be formed by using, e.g., a CVD method. As an example, dichlorosilane and ammonia ($NH_3$) gases are supplied into the reaction chamber at 0.1 slm and 1 slm, respectively, while maintaining the internal temperature of the reaction chamber (in which the semiconductor substrate 51 having the silicon oxide film 52 formed thereon is accommodated) at 700 to 800 degrees C. and the internal pressure of the reaction chamber at 13.3 to 133 Pa (0.1 to 1 Torr) so that the silicon nitride film 53 is formed on the silicon oxide film 52.

Figure 3:
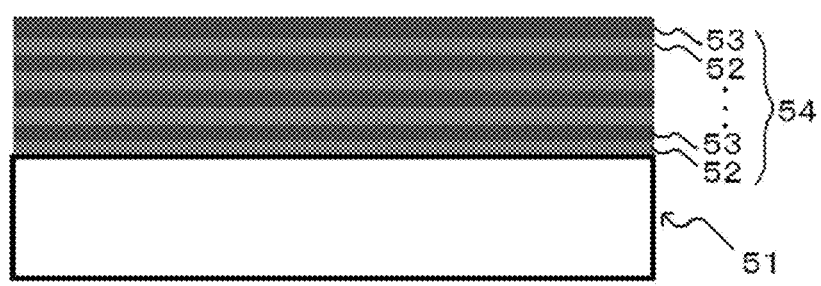
FIG. 3 is a view illustrating a method of forming a stacked film in a method of manufacturing a stacked semiconductor device according to one embodiment of the present disclosure.

Thereafter, as shown in FIG. 3, the silicon oxide films 52 and the silicon nitride films 53 are further alternately formed. Thus, a stacked film 54 obtained by alternately arranging the silicon oxide films 52 and the silicon nitride films 53 is formed on the semiconductor substrate 51. In one embodiment, the stacked film 54 may be obtained by sequentially performing the aforementioned operations of forming the silicon oxide film 52 and the silicon nitride film 53 on the semiconductor substrate 51.

Figure 4:
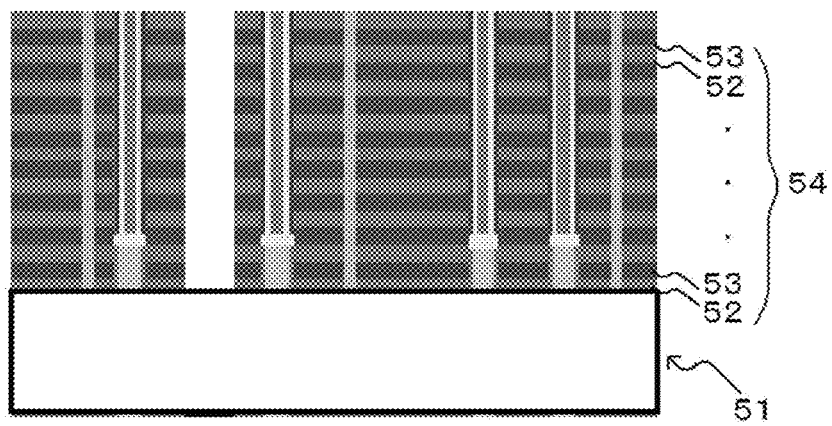
FIG. 4 is a view illustrating a method of forming trenches, electrodes and the like in the stacked film in a method of manufacturing a stacked semiconductor device according to one embodiment of the present disclosure.

Subsequently, as shown in FIG. 4, trenches, electrodes and the like are formed in the stacked film 54. For example, the trenches are formed in the stacked film 54 by selectively removing (or etching) the stacked film 54 using a predetermined mask. In addition, the electrodes are formed by filling each of the trenches with a conductive film made of metal such as tungsten (W), aluminum (Al), copper (Cu) or the like.

Figure 5:
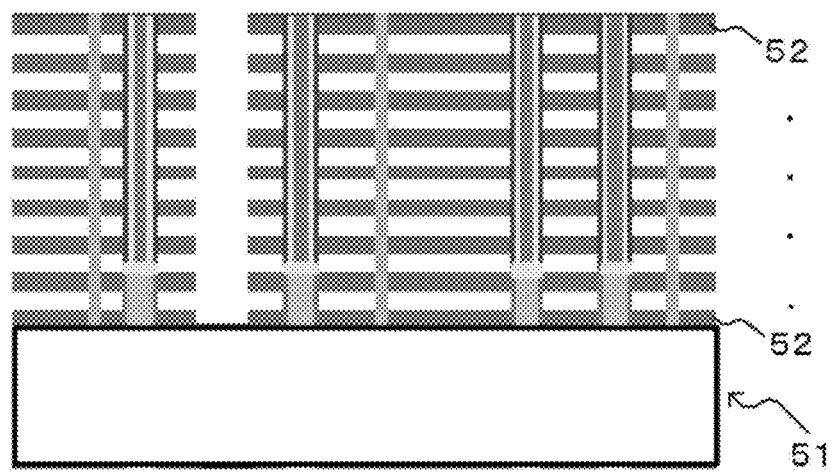
FIG. 5 is a view illustrating a method of removing silicon nitride films from the stacked film in a method of manufacturing a stacked semiconductor device according to one embodiment of the present disclosure.

Subsequently, as shown in FIG. 5, the silicon nitride films 53 used as the sacrificial films are removed (etched). This etching may be either a wet etching or dry etching. For the wet etching, the stacked film 54 may be immersed within, e.g., a phosphoric acid solution ($H_3PO_4$) heated at about 160 degrees C. to remove the silicon nitride films 53. For the dry etching, an etching gas containing, e.g., a halogen gas such as fluorine, may be supplied into the reaction chamber to remove the silicon nitride films 53 from the stacked film 54.

As described above, in this embodiment, the triethoxysilane gas is used to form the silicon oxide films 52, thus allowing the silicon oxide films 52 to have a high DHF resistance. This makes it possible to remove only the silicon nitride films 53 without affecting the silicon oxide films 52.

Subsequently, the silicon oxide films 52 are subjected to a treatment process. The treatment process is a modification process for reducing a concentration of carbons contained in each of the silicon oxide films 52 to improve the leak resistance of each of the silicon oxide films 52. The treatment process includes supplying hydrogen ($H_2$) and oxygen ($O_2$) gases into a reaction tube while maintaining the internal temperature of the reaction chamber at 600 to 800 degrees C. and the internal pressure thereof at 13.3 to 1.33 kPa (0.1 to 10 Torr), and removing the carbons contained in each of the silicon oxide films 52. Thus, the concentration of carbons contained in each of the silicon oxide films 52 is reduced, thereby improving the leak resistance of each of the silicon oxide films 52.

In this case, the DHF resistance of each of the silicon oxide films 52 may be reduced by the treatment process. However, in this stage, since the silicon nitride films 53 have been already removed and a shaping process of a stacked semiconductor device has been completed, the silicon oxide films 52 need not have the high DHF resistance anymore. Therefore, no problem occurs even when the DHF resistance of each of the silicon oxide films 52 is reduced by the treatment process.

Figure 6:
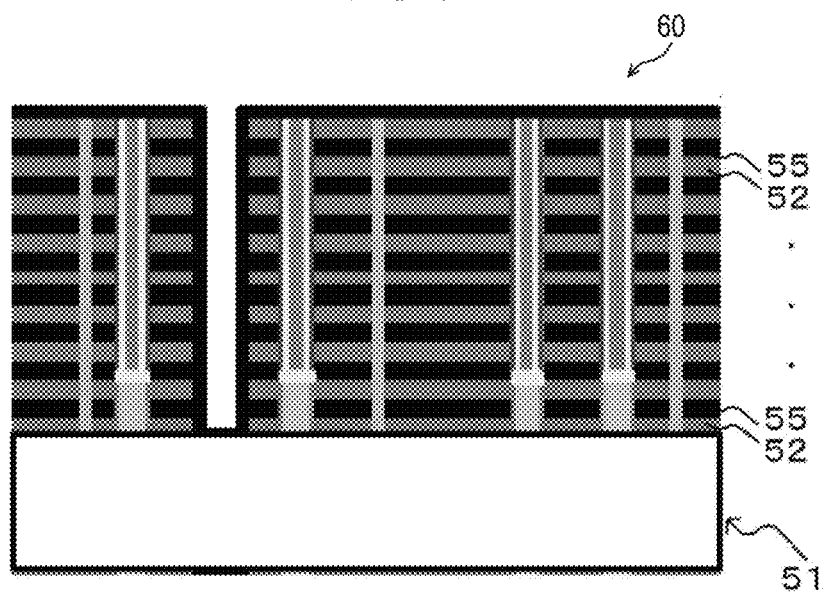
FIG. 6 is a view illustrating a method of manufacturing a stacked semiconductor device according to one embodiment of the present disclosure.

Subsequently, a plurality of electrodes 55 made of metal such as tungsten is formed in respective regions where the silicon nitride films 53 are removed. Thus, as shown in FIG. 6, a stacked semiconductor device 60 is formed.

As described above, the stacked semiconductor device 60 is obtained by forming the silicon oxide films 52 as the interlayer insulation films using the triethoxysilane gas, followed by removing the silicon nitride films 53, followed by applying the treatment process onto the silicon oxide films 52. This allows each of the silicon oxide films 52 to have the high DHF resistance in the course of the removal of the silicon nitride films 53. Further, as described above, since the concentration of carbons contained in each of the silicon oxide films 52 is reduced by the treatment process, no problem occurs in the leak resistance of each of the silicon oxide films 52, which is required in manufacturing the stacked semiconductor device 60. Therefore, it is possible to provide the high quality stacked semiconductor device 60 by using the above method of manufacturing the stacked semiconductor device 60.

Next, an apparatus of manufacturing the stacked semiconductor device 60 according to another embodiment will be described. This embodiment will be described with an example where a batch-type vertical heat treatment apparatus 1 shown in FIG. 7 is used as the stacked semiconductor device manufacturing apparatus.

Figure 7:
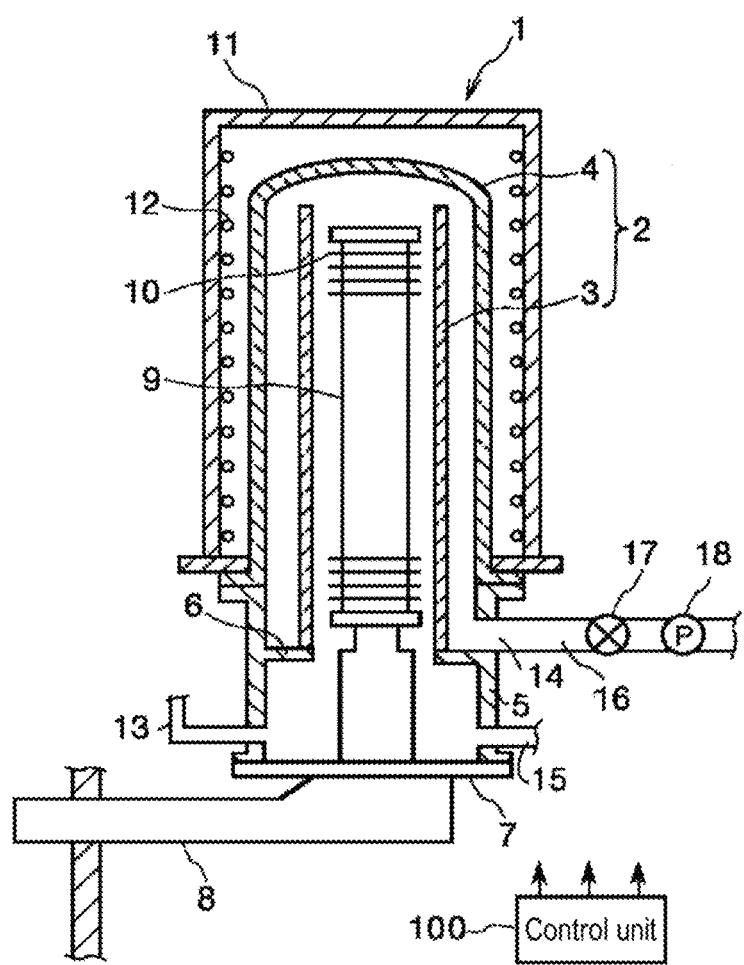
FIG. 7 is a view showing a heat treatment apparatus according to another embodiment of the present disclosure.

As shown in FIG. 7, the heat treatment apparatus 1 includes a substantially cylindrical reaction tube 2 whose longitudinal direction extends in a vertical direction. The reaction tube 2 has a double tube structure including an inner tube 3 and an outer tube 4 provided with a roof and formed to surround the inner tube 3 with a specified gap therebetween. The inner tube 3 and the outer tube 4 are made of a material having an increased heat resistance and a corrosion resistance, e.g., quartz.

A tubular manifold 5 made of a stainless steel (SUS) is arranged below the outer tube 4. The manifold 5 is air-tightly connected to a lower end of the outer tube 4. The inner tube 3 is supported by a support ring 6 protruding from an inner surface of the manifold 5. The support ring 6 is integrally formed with the manifold 5.

A lid 7 is arranged below the manifold 5. The lid 7 is configured to move upward and downward by operations of a boat elevator 8. Specifically, a lower opening (throat portion) of the manifold 5 is closed if the lid 7 is moved up by the boat elevator 8, and is opened if the lid 7 is moved down by the boat elevator 8.

A boat 9 made of, e.g., quartz, is placed on the lid 7. The boat 9 is configured to hold a plurality of objects to be processed, e.g., semiconductor substrates 10, each of which is vertically spaced-apart at a predetermined interval.

A heat insulator 11 is provided around the reaction tube 2 to surround the reaction tube 2. Temperature-elevating heaters 12 composed of, e.g., resistance heating elements, are provided on an inner wall surface of the heat insulator 11. The inside of the reaction tube 2 is heated to a specified temperature by the temperature-elevating heaters 12 so that the semiconductor substrates 10 are heated to a predetermined temperature.

A plurality of processing gas inlet pipes 13 is inserted through the sidewall of the manifold 5. Only one of the processing gas inlet pipes 13 is depicted in FIG. 7, for the sake of simplicity. The processing gas inlet pipes 13 are arranged to face toward the inside of the inner tube 3. As shown in FIG. 7, the processing gas inlet pipes 13 are inserted through the sidewall of the manifold 5 at the lower side of the support ring 6 (or the inner tube 3).

The processing gas inlet pipes 13 are coupled to a processing gas supply source (not shown) through a respective mass flow controller (not shown) and so forth. With this configuration, a desired amount of processing gas is supplied from the processing gas supply source into the reaction tube 2 through the processing gas inlet pipe 13. Examples of the processing gas to be supplied through the processing gas inlet pipe 13 may include a film-forming gas used to form the stacked film 54, a treatment gas used to perform the treatment process, or the like. Examples of the film-forming gas may include the triethoxysilane gas used to form the silicon oxide film 52, the dichlorosilane gas used to form the silicon nitride film 53, and ammonia. Examples of the treatment gas may include the hydrogen and oxygen gases.

An exhaust port 14 through which the gas present inside the reaction tube 2 is exhausted, is provided in the sidewall of the manifold 5. The exhaust port 14 is arranged above the support ring 6 to communicate with a space defined between the inner tube 3 and the outer tube 4 of the reaction tube 2. This allows the gas generated inside the inner tube 3 to be discharged to the exhaust port 14 through the space defined between the inner tube 3 and the outer tube 4.

A purge gas supply pipe 15 is arranged below the exhaust port 14 to insert through the sidewall of the manifold 5. The purge gas supply pipe 15 is coupled to a purge gas supply source (not shown). In this configuration, a desired amount of purge gas, e.g., nitrogen gas, is supplied from the purge gas supply source into the reaction tube 2 through the purge gas supply pipe 15.

An exhaust pipe 16 is air-tightly connected to the exhaust port 14. A valve 17 and a vacuum pump 18 are sequentially arranged along the exhaust pipe 16 in that order from the upstream side. The valve 17 is configured to regulate an opening degree of the exhaust pipe 16, thereby controlling the internal pressure of the reaction tube 2 at a predetermined value. The vacuum pump 18 is configured to discharge the gas existing inside the reaction tube 2 through the exhaust pipe 16, consequently regulating the internal pressure of the reaction tube 2.

A trap and a scrubber (both not shown) are arranged along the exhaust pipe 16 to detoxify the gas discharged from the reaction tube 2 before the gas is exhausted to the outside of the heat treatment apparatus 1.

Figure 8:
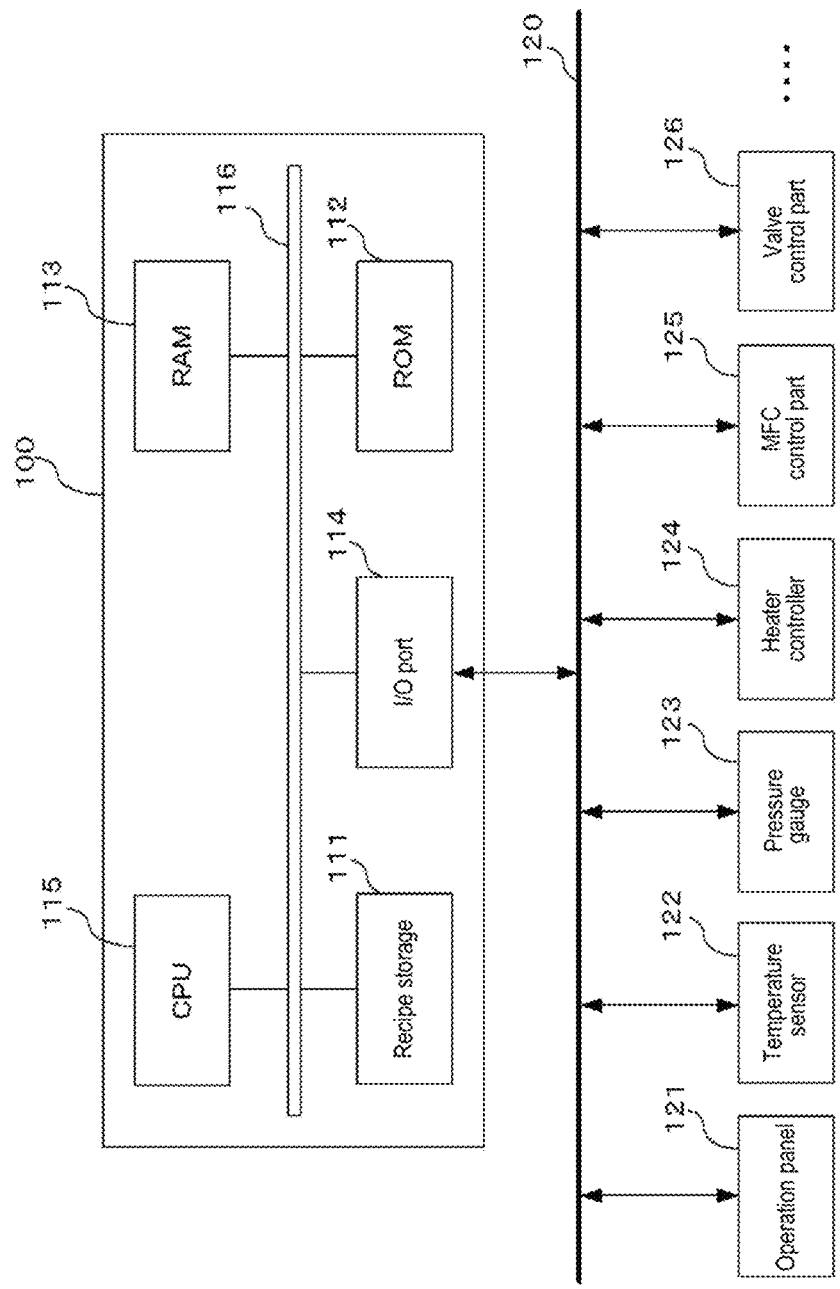
FIG. 8 is a view showing a configuration of a controller of FIG. 7.

The heat treatment apparatus 1 includes a control unit 100 configured to control respective units or parts of the heat treatment apparatus 1. A configuration of the control unit 100 is shown in FIG. 8. As shown in FIG. 8, an operation panel 121, a temperature sensor (group) 122, a pressure gauge (group) 123, a heater controller 124, a MFC (mass flow controller) controller 125, a valve controller 126 are connected to the control unit 100 through a bus 120.

The operation panel 121 is equipped with a display screen and operation buttons. The operation panel 121 transfers operation instructions of an operator to the control unit 100 and allows the display screen to display various kinds of information supplied from the control unit 100.

The temperature sensor (group) 122 is configured to measure an internal temperature of each of the reaction tube 2, the processing gas inlet pipes 13, the exhaust pipe 16 and the like, and notify the control unit 100 of the measured temperature values. The pressure gauge (group) 123 is configured to measure an internal pressure of each of the reaction tube 2, the processing gas inlet pipes 13 and the exhaust pipe 16, and notify the control unit 100 of the measured pressure values.

The heater controller 124 is configured to independently control each of the temperature-elevating heaters 12. In response to the instructions supplied from the control unit 100, the heater controller 124 applies power to the temperature-elevating heaters 12 such that they generate heat. Further, the heater controller 124 is configured to measure a power consumption of each of the temperature-elevating heaters 12 and notify the measurements to the control unit 100.

The MFC controller 125 is configured to control MFCs (not shown) installed in the processing gas inlet pipes 13 and the purge gas supply pipe 15 such that the flow rates of gases flowing through the MFCs become equal to flow rates instructed by the control unit 100. Further, the MFC controller 125 is configured to measure the flow rates of the gases actually flowing through the MFCs and notify the measurements to the control unit 100.

The valve controller 126 is configured to control opening degrees of valves (including the valve 17) arranged in the pipes 13, 15 and 16 to meet values instructed by the control unit 100.

The control unit 100 includes a recipe storage unit 111, a ROM (Read Only Memory) 112, a RAM (Random Access Memory) 113, an I/O (Input/Output) port 114, a CPU (Central Processing Unit) 115, and a bus 116 interconnecting these units or parts.

The recipe storage unit 111 stores a setup recipe and a plurality of process recipes. Only the setup recipe is stored in the recipe storage unit 111 when the heat treatment apparatus 1 is first manufactured. The setup recipe is executed to create heating models corresponding to different heat treatment apparatuses. The process recipes are prepared in a corresponding relationship with heat treatments (processes) actually performed pursuant to the user's desire. For example, the process recipes define a variation in temperature of a respective unit or part, a variation in pressure of the reaction tube 2, start and stop timings for supplying the processing gas, and a supply amount of the processing gas during a period of a time from when the semiconductor substrates 10 are loaded into the reaction tube 2 to when the processed semiconductor substrates 10 are unloaded from the reaction tube 2.

The ROM 112 includes an EEPROM (Electrically Erasable Programmable Read Only Memory), a flash memory, a hard disk and so forth. The ROM 112 is a storage medium for storing an operation program of the CPU 115. The RAM 113 serves as a work area of the CPU 115.

The I/O port 114 is connected to the operation panel 121, the temperature sensor (group) 122, the pressure gauge (group) 123, the heater controller 124, the MFC controller 125, the valve controller 126 and the like to control input and output of data or signals.

The CPU 115 makes up a core of the control unit 100 and executes the control program stored in the ROM 112. In response to instructions provided from the operation panel 121, the CPU 115 controls the operation of the heat treatment apparatus 1 based on the recipes (i.e., the process recipes) stored in the recipe storage unit 111. Specifically, the CPU 115 controls the temperature sensor (group) 122, the pressure gauge (group) 123, and the MFC controller 125 and the like to respectively measure the temperature, the pressure and the flow rate inside each of the reaction tube 2, the processing gas inlet pipes 13 and the exhaust pipe 16. Based on the measurements obtained thus, the CPU 115 outputs control signals to the heater controller 124, the MFC controller 125 and the valve controller 126 and controls them to operate according to the process recipes. The bus 116 is used to transfer information between the respective units or parts.

Next, a method of manufacturing the stacked semiconductor device 60 using the heat treatment apparatus 1 configured as above will be described according to another embodiment. This embodiment will be illustrated with operations of forming the stacked film 54 obtained by alternately arranging the silicon oxide films 52 and the silicon nitride films 53 on the semiconductor substrate 51, and performing a modification process (treatment process) for reducing a concentration of carbons contained in the silicon oxide films 52 after the removal of the silicon nitride films 53.

In the following description, operations of the respective units or parts constituting the heat treatment apparatus 1 are controlled by the control unit 100 (the CPU 115). As described above, the control unit 100 (the CPU 115) is configured to control the heater controller 124 (the temperature-elevating heaters 12), the MFC controller 125 and the valve controller 126 such that, in each of the operations, the internal temperatures and the internal pressures of the reaction tube 2 and the flow rates of gases are set to conditions according to recipes depicted in FIGS. 9 and 10. FIG. 9 is a view illustrating a recipe for describing the operation of forming the stacked film 54. FIG. 10 is a view illustrating a recipe for describing the treatment process.

First, the operation of forming the stacked film 54 will be described.

As shown in (a) of FIG. 9, the internal temperature of the reaction tube 2 (the inner tube 3) is set equal to a predetermined temperature. Further, as shown in (b) of FIG. 9, the internal pressure of the reaction tube 2 (the inner tube 3) is set equal to a normal pressure. Subsequently, as shown in (c) of FIG. 9, a specified amount of nitrogen gas is supplied from the purge gas supply pipe 15 into the inner tube 3 (the reaction tube 2). Subsequently, the boat 9 accommodating the semiconductor substrates 10 is placed on the lid 7. Thereafter, the lid 7 is moved up by the boat elevator 8 to load the semiconductor substrates 10 (the boat 9) into the reaction tube 2 (in a load operation).

Subsequently, as shown in (c) of FIG. 9, a specified amount of nitrogen gas is supplied from the purge gas supply pipe 15 into the inner tube 3. The internal temperature of the reaction tube 2 is set equal to a predetermined temperature, e.g., 700 degrees C., as shown in (a) of FIG. 9. Further, the gas existing inside the reaction tube 2 is discharged to reduce the internal pressure of the reaction tube 2 to a predetermined pressure, e.g., 40 Pa (0.3 Torr), as shown in (b) of FIG. 9. Thus, the inside of the reaction tube 2 is stabilized at this temperature and pressure (in a stabilization operation).

Upon the stabilization of in the inside of the reaction tube 2, the supply of nitrogen gas from the purge gas supply pipe 15 into the inner tube 3 is stopped. Then, as shown in (d) of FIG. 9, a specified amount (e.g., 1 slm) of triethoxysilane gas is supplied from the processing gas inlet pipes 13 into the reaction tube 2. Thus, the silicon oxide ($SiO_2$) film 52 is formed on the surface of the semiconductor substrate 51.

According to this embodiment, the triethoxysilane gas is used to form the silicon oxide film 52, which increase the DHF resistance of the silicon oxide film 52. This makes it possible to remove (or etch) only the silicon nitride film 53 without affecting the silicon oxide film 52.

If the silicon oxide film 52 having a predetermined thickness is formed on the semiconductor substrate 10 (or 51), the supply of the triethoxysilane gas from the processing gas inlet pipes 13 into the reaction tube 2 is stopped. Subsequently, as shown in (c) of FIG. 9, a specified amount of nitrogen gas is supplied from the purge gas supply pipe 15 into the inner tube 3. The internal temperature of the reaction tube 2 is set equal to a predetermined temperature, e.g., 700 degrees C., as shown in (a) of FIG. 9. Further, the gas existing inside the reaction tube 2 is discharged to decrease the internal pressure of the reaction tube 2 to a predetermined pressure, e.g., 133 Pa (1 Torr), as shown in (b) of FIG. 9 (in a purge/stabilization operation).

Upon the stabilization of the inside of the reaction tube 2, the supply of nitrogen from the purge gas supply pipe 15 into the reaction tube 2 is stopped. Then, as shown in (e) of FIG. 9, a specific amount (e.g., 0.1 slm) of a film-forming gas, e.g., DCS gas used as a silicon source, is supplied from the process gas inlet pipe 13 into the reaction tube 2. Further, as shown in (f) of FIG. 9, a specific amount (e.g., 1 slm) of $NH_3$ gas used as a nitridant is supplied from the process gas inlet pipe 13 into the reaction tube 2 (in a SiN film forming operation). Thus, the silicon nitride film 53 is formed on the silicon oxide film 52.

If the silicon nitride film 53 having a predetermined thickness is formed on the silicon oxide film 52, the supply of the DCS gas from the process gas inlet pipe 13 into the reaction tube 2 is stopped. Subsequently, as shown in (c) of FIG. 9, a specific amount of nitrogen gas is supplied from the purge gas supply pipe 15 into the inner tube 3 to discharge the gas existing inside the reaction tube 2 (in a purge operation).

Subsequently, a series of the operations as described above, i.e., the stabilization operation, the SiO$_2$ film forming operation, the purge/stabilization operation, the SiN film forming operation and the purge operation, are repeatedly performed to form the stacked film 54. Upon the formation of the stacked film 54, a specific amount of nitrogen gas is supplied from the purge gas supply pipe 15 into the inner tube 3 as shown in (c) of FIG. 9. Further, the internal temperature of the reaction tube 2 is set equal to a predetermined temperature as shown in (a) of FIG. 9. In addition, the gas existing in the reaction tube 2 is discharged to return the reaction tube 2 to the normal pressure. Then, the lid 7 is moved down by the boat elevator 8 so that the semiconductor substrates 10 (the boat 9) are unloaded from the reaction tube 2 (in an unload operation). Thus, the formation of the stacked film 54 is completed.

Next, the treatment process will be described.

First, as shown in (a) of FIG. 10, the internal temperature of the reaction tube 2 (the inner tube 3) is set equal to a predetermined temperature. Further, as shown in (b) of FIG. 10, the internal pressure of the reaction tube 2 (the inner tube 3) is set equal to the normal pressure. Subsequently, as shown in (c) of FIG. 10, a specific amount of the nitrogen gas is supplied from the purge gas supply pipe 15 into the inner tube 3 (the reaction tube 2). Thereafter, the boat 9 in which the semiconductor substrates 10 (or 51) having the stacked film 54 formed thereon is accommodated, is placed on the lid 7. Then, the lid 7 is moved up by the boat elevator 8 to load the semiconductor substrates 10 (the boat 9) into the reaction tube 2 (in a load operation).

Subsequently, as shown in (c) of FIG. 10, a specific amount of the nitrogen gas is supplied from the purge gas supply pipe 15 into the inner tube 3. The internal temperature of the reaction tube 2 is set equal to a predetermined temperature, e.g., 780 degrees C., as shown in (a) of FIG. 10. In addition, the gas existing inside the reaction tube 2 is discharged to reduce the internal pressure of the reaction tube 2 to a predetermined pressure, e.g., 133 Pa (1 Torr), as shown in (b) of FIG. 10. Thus, the inside of the reaction tube 2 is stabilized to the predetermined temperature and pressure (in a stabilization operation).

Upon the stabilization of the inside of the reaction tube 2, the supply of the nitrogen gas from the purge gas supply pipe 15 into the inner tube 3 is stopped. Then, as shown in (d) of FIG. 10, a specific amount (e.g., 1 slm) of the treatment gas, e.g., hydrogen (H$_2$), is supplied from the process gas inlet pipe 13 into the reaction tube 2.

Further, as shown in (e) of FIG. 10, a specific amount (e.g., 1.7 slm) of oxygen (O$_2$) is supplied from the process gas inlet pipe 13 into the reaction tube 2. Thus, carbons contained in each of the silicon oxide films 52 are removed (in a treatment operation). As a result, the concentration of carbons contained in each of the silicon oxide films 52 is reduced, thus improving the leak resistance of each of the silicon oxide films 52. As described above, in this case, the DHF resistance of each of the silicon oxide films 52 is reduced by the treatment process. However, in this stage, since the silicon nitride films 53 have been already removed and a shaping process of the stacked semiconductor device 60 has been completed, the silicon oxide films 52 need not have the high DHF resistance anymore. Therefore, no problem occurs even when the DHF resistance of each of the silicon oxide films 52 is reduced by the treatment process.

If a predetermined amount of the carbons contained in each of the silicon oxide films 52 is removed, the supply of the film-forming gas from the process gas inlet pipe 13 into the inner tube 3 is stopped. Subsequently, as shown in (c) of FIG. 10, a specific amount of the nitrogen gas is supplied from the purge gas supply pipe 15 into the inner tube 3 to discharge the gas existing in the reaction tube 2 (in a purge/stabilization operation). At this time, as shown in (a) of FIG. 10, the internal temperature of the reaction tube 2 is set equal to a predetermined temperature. Further, the gas existing in the reaction tube 2 is discharged to return the inside of the reaction tube 2 to the normal pressure. Then, the lid 7 is moved down by the boat elevator 8 to unload the semiconductor substrates 10 (the boat 9) from the reaction tube 2 (in an unload operation). Thus, the treatment process is completed.

As described above, according to this embodiment, the triethoxysilane gas is used to form the silicon oxide film 52 used as the interlayer insulation film, which makes it possible to allow the silicon oxide film 52 to have the high DHF resistance in the course of removal of the silicon nitride film 53. Further, as described above, since the concentration of carbons contained in the silicon oxide film 52 is reduced by the treatment process, no problem occurs in the leak resistance of the silicon oxide film 52, which is required in manufacturing the stacked semiconductor device 60. Therefore, it is possible to provide the high quality stacked semiconductor device 60 by using the above method of manufacturing the stacked semiconductor device 60.

The present disclosure is not limited to the embodiment described above but may be modified or applied in many different forms. Other embodiments applicable to the present disclosure will be described below.

While in the above embodiments, the triethoxysilane gas has been described to be used to form the silicon oxide film 52 used as the interlayer insulation film of the stacked semiconductor device 60, the present disclosure is not limited thereto. In some embodiments, another gases such as octamethylcyclotetrasiloxane ($(Si(CH_3)_2O)_4$), hexamethyldisilazane ($(CH_3)_3SiNHSi(CH_3)_3$) or diethylsilane ($(CH_3CH_2)_2SiH_2$) may be used to form the silicon oxide film 52. By forming the silicon oxide film 52 using such gases, the DHF resistance of the silicon oxide film 52 can be significantly improved as compared with a case where the dichlorosilane gas is used to form the HTO film. This makes it possible to remove only the silicon nitride film 53 without affecting the silicon oxide film 52. Further, as described above, since the concentration of carbons contained in the silicon oxide film 52 is reduced by the treatment process after the removal of the silicon nitride film 53, no problem occurs in the leak resistance of the silicon oxide film 52. Therefore, it is possible to provide the high quality stacked semiconductor device 60 by using the above method of manufacturing the stacked semiconductor device 60.

Although in the above embodiments, the silicon oxide film 52 has been described to be formed on the semiconductor substrate 10 (or 51) by supplying the triethoxysilane gas into the reaction tube 2 while maintaining the inside of the reaction tube 2 at 700 degrees C. and 40 Pa (0.3 Torr), various methods may be applied as long as they can form a silicon oxide film having improved DHF resistance using gases other than the triethoxysilane gas.

Although in the above embodiments, the silicon nitride film 53 has been described to be formed on the silicon oxide film 52 by supplying the DCS and NH$_3$ gases into the reaction tube 2 while maintaining the inside of the reaction tube 2 at 700 degrees C. and 133 Pa (1 Torr), various methods may be applied as long as they can form the silicon nitride film 53 on the silicon oxide film 52.

While in the above embodiments, the hydrogen (H$_2$) and oxygen (O$_2$) gases has been described to be used so as to reduce the concentration of carbons contained in the silicon oxide film 52, various methods may be applied as long as they can reduce the concentration of carbons contained in the silicon oxide film 52.

While in the above embodiments, the batch-type vertical heat treatment apparatus 1 having the double tube structure has been described to be used as the manufacturing apparatus. As an alternative example, the present disclosure may be applied to a batch-type vertical heat treatment apparatus having a single tube structure.

The control unit 100 employed in the embodiments of the present disclosure can be also realized using a typical computer system instead of a dedicated control system. For example, the control unit 100 for performing the afore-mentioned processes can be configured by installing programs for execution of the processes into a general-purpose computer through the use of a recording medium (e.g., a flexible disk or a CD-ROM) storing the programs.

The programs can be provided by an arbitrary means. The programs may be provided not only by the recording medium mentioned above but also through a communication line, a communication network, a communication system or the like. In the latter case, the programs may be posted on bulletin boards (BBS: Bulletin Board System) and provided through a network together with carrier waves. The program thus provided is started up and executed in the same manner as other application programs under the control of an operating system, thereby performing the processes described above.

According to the present disclosure in some embodiments, it is possible to provide a stacked semiconductor device having good properties and a method and apparatus of manufacturing the stacked semiconductor device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a stacked semiconductor device, comprising:
    forming a stacked film on a semiconductor substrate, the stacked film including a plurality of silicon oxide films and a plurality of silicon nitride films, which are alternately arranged on top of each other, and the stacked film being obtained by repeatedly performing a series of operations of forming the silicon oxide film on the semiconductor substrate using one of triethoxysilane, octamethylcyclotetrasiloxane, hexamethyldisilazane and diethylsilane gases, and forming the silicon nitride film on the formed silicon oxide film;
    etching the silicon nitride films in the stacked film;
    after etching the silicon nitride films, removing carbons contained in the silicon oxide films, which are not removed in the etching, to reduce a concentration of the carbons; and
    forming electrodes in regions where the silicon nitride films are etched in the etching.

2. The method of claim 1, wherein removing includes supplying hydrogen and oxygen gases into the silicon oxide films.

3. The method of claim 1, wherein removing is performed after a shaping process of the stacked semiconductor device.

4. A stacked semiconductor device manufactured by the method of claim 1.

* * * * *